(12) United States Patent
Nakamura

(10) Patent No.: US 8,384,197 B2
(45) Date of Patent: Feb. 26, 2013

(54) SEMICONDUCTOR DEVICE AND METHOD FOR MANUFACTURING SAME

(75) Inventor: Toshimi Nakamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 13/052,334

(22) Filed: Mar. 21, 2011

(65) Prior Publication Data

US 2011/0241164 A1    Oct. 6, 2011

(30) Foreign Application Priority Data

Mar. 31, 2010   (JP) .................................. 2010-82963

(51) Int. Cl.
*H01L 27/118*   (2006.01)
*H01L 23/544*   (2006.01)
*H01L 21/00*    (2006.01)

(52) U.S. Cl. ......... 257/620; 257/210; 438/113; 438/462

(58) Field of Classification Search ................... 257/210, 257/620; 438/113, 462
See application file for complete search history.

(56) References Cited

U.S. PATENT DOCUMENTS

2004/0145028 A1    7/2004   Matsumoto et al.
2010/0237508 A1*   9/2010   Utsumi .................... 257/774

FOREIGN PATENT DOCUMENTS

| JP | 2004-235357 | 8/2004 |
| JP | 2008-098605 | 4/2008 |
| JP | 2011-134893 | 7/2011 |

OTHER PUBLICATIONS

Japanese Office Action for Japanese Application No. 2010-082963 mailed on Jul. 23, 2012.

* cited by examiner

*Primary Examiner* — Jarrett Stark
*Assistant Examiner* — Nicholas Tobergte
(74) *Attorney, Agent, or Firm* — Turocy & Watson, LLP

(57) ABSTRACT

According to one embodiment, a semiconductor device includes a semiconductor substrate, an inter-layer insulating film, a wiring, and a via. The inter-layer insulating film is provided on the semiconductor substrate. The wiring is provided in the inter-layer insulating film. The via is provided in the inter-layer insulating film. Inside the inter-layer insulating film in a circumferential region around a device region, a vertical structure body is formed in which the wiring and the via are vertically connected. At least in an upper portion inside the inter-layer insulating film in an edge region located around the circumferential region and constituting an outer edge portion, no vertical structure body is formed in which the wiring and the via are vertically connected.

20 Claims, 9 Drawing Sheets

US 8,384,197 B2

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2010-082963, filed on Mar. 31, 2010; the entire contents of which are incorporated herein by reference.

FIELD

Embodiments described herein relate generally to a semiconductor device and a method for manufacturing the same.

BACKGROUND

Recently, in semiconductor devices including a multilayer wiring film provided on a silicon substrate, with the miniaturization of the wiring and wiring spacing, a low dielectric film (low-k film) has been used for the inter-layer insulating film. However, in general, the low dielectric film has low adhesiveness to the metal wiring. Therefore, there is a problem in which the inter-layer insulating films are peeled apart from each other due to chipping impact in the dicing process and the thermal stress applied after packaging.

To solve this problem, there is proposed a technique in which a vertical structure body made of wirings and vias is provided in the circumferential region of the chip. The vertical structure body is a structure in which wirings and vias are vertically connected in the inter-layer insulating film (see, e.g., JP-A 2004-235357 (Kokai)).

DETAILED DESCRIPTION

In general, according to one embodiment, a semiconductor device includes a semiconductor substrate, an inter-layer insulating film, a wiring, and a via. The inter-layer insulating film is provided on the semiconductor substrate. The wiring is provided in the inter-layer insulating film. The via is provided in the inter-layer insulating film. Inside the inter-layer insulating film in a circumferential region around a device region, a vertical structure body is formed in which the wiring and the via are vertically connected. At least in an upper portion inside the inter-layer insulating film in an edge region located around the circumferential region and constituting an outer edge portion, no vertical structure body is formed in which the wiring and the via are vertically connected.

According to another embodiment, a method is disclosed for manufacturing a semiconductor device. The method can form a multilayer wiring film including a wiring and a via provided in an inter-layer insulating film on a semiconductor wafer including a plurality of device regions partitioned by a scribe line region. In addition, the method can divide the multilayer wiring film and the semiconductor wafer for each of the device regions by dicing part of a dicing region defined in the scribe line region. In the forming of the multilayer wiring film, a vertical structure body is formed in which the wiring and the via are vertically connected inside the inter-layer insulating film in a region of the scribe line region except the dicing region, and no vertical structure body is formed in which the wiring and the via are vertically connected at least in an upper portion inside the inter-layer insulating film in the dicing region.

Embodiments of the invention will now be described with reference to the drawings.

First, a first embodiment of the invention is described.

Figure 1:
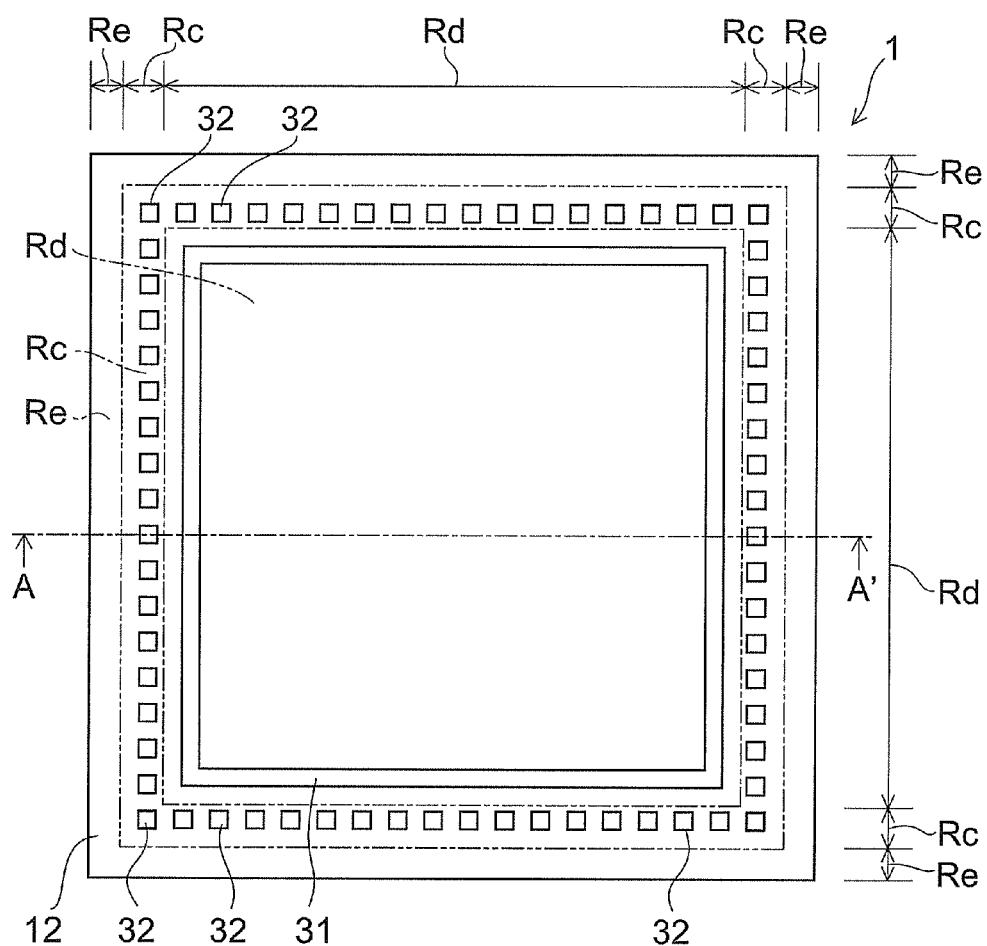
FIG. 1 is a plan view illustrating a semiconductor device according to a first embodiment.

FIG. 1 is a plan view illustrating a semiconductor device according to this embodiment.

Figure 2:
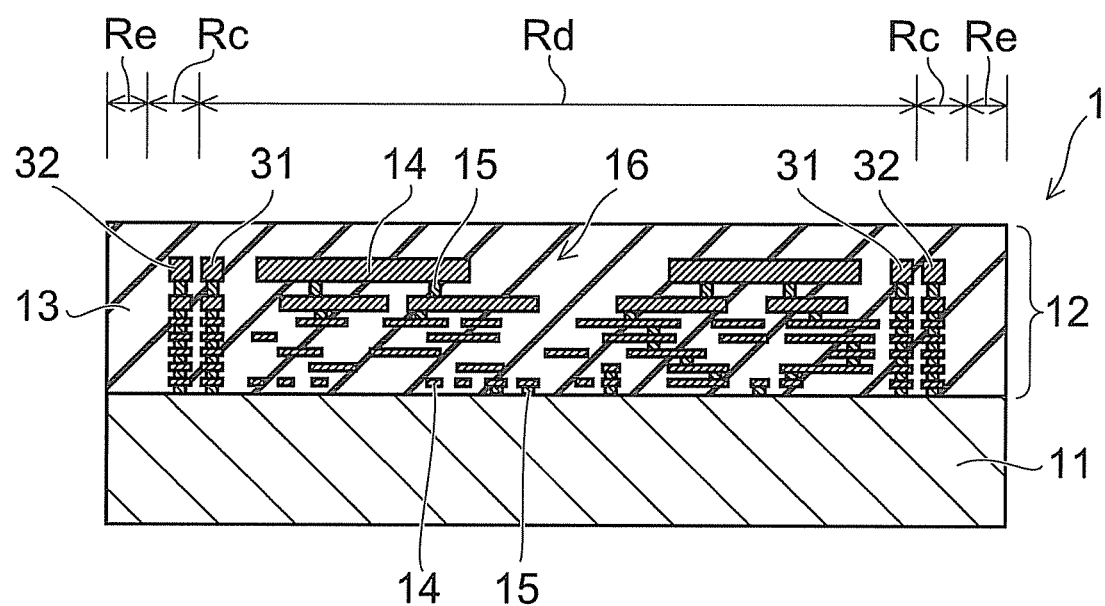
FIG. 2 is a cross-sectional view taken along line A-A' shown in FIG. 1.

FIG. 2 is a cross-sectional view taken along line A-A' shown in FIG. 1.

Figure 3:
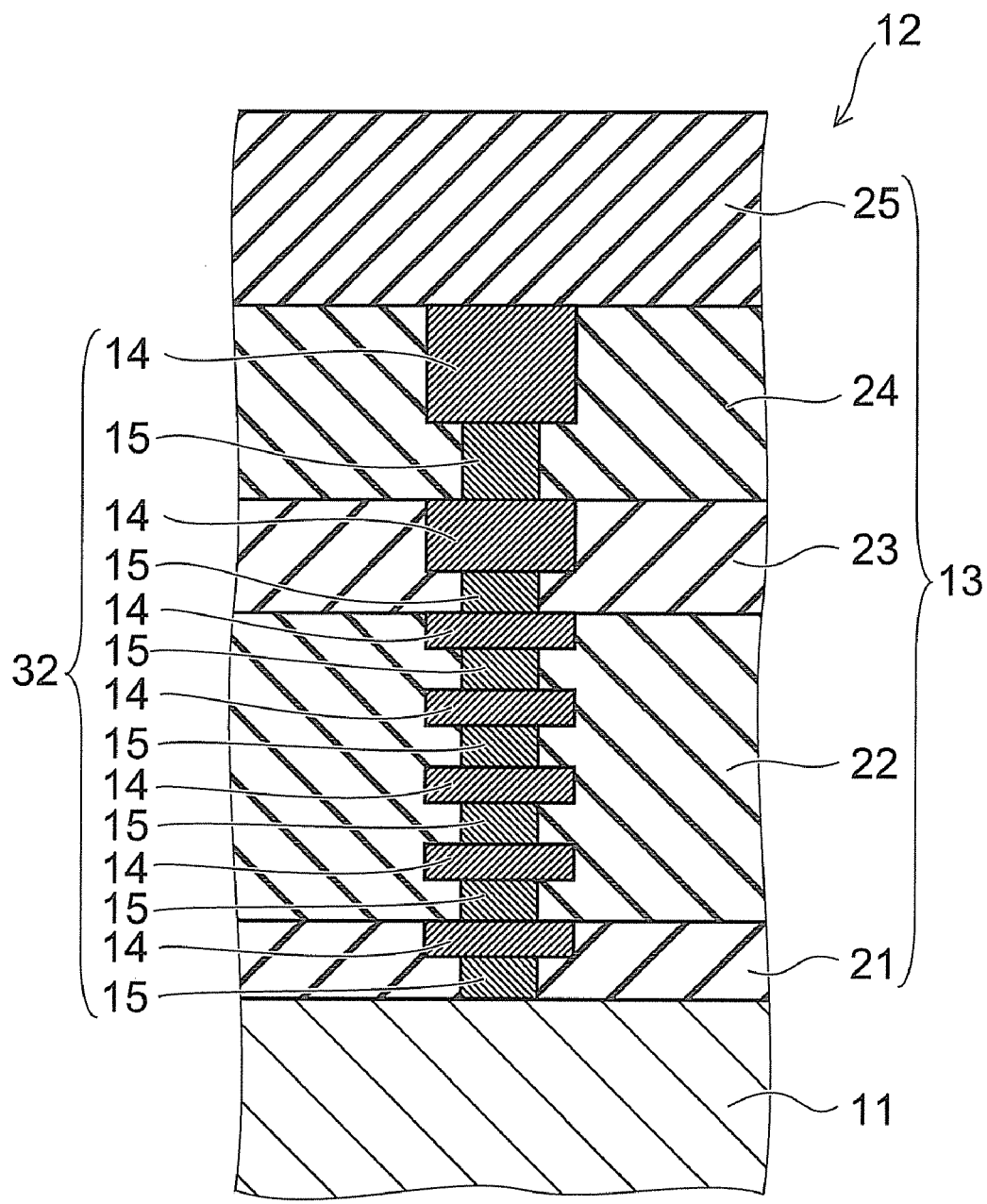
FIG. 3 is a cross-sectional view illustrating one vertical structure body.

FIG. 3 is a cross-sectional view illustrating one vertical structure body.

Here, the semiconductor device is shown schematically in FIG. 1 to FIG. 3. For instance, in FIG. 1 and FIG. 2, the vertical structure bodies are shown larger and less than in reality. Furthermore, FIG. 1 schematically shows the ring and the vertical structure bodies, but omits the portion of the inter-layer insulating film above the ring and the vertical structure bodies and the integrated circuit. This also applies to similar figures described below.

As shown in FIG. 1 to FIG. 3, the semiconductor device 1 according to this embodiment includes a silicon substrate 11. A multilayer wiring film 12 is provided entirely on the silicon substrate 11. In the multilayer wiring film 12, wirings 14 and vias 15 made of metal material are formed in multiple stages in an inter-layer insulating film 13 made of an insulating material. For instance, the semiconductor device 1 is a SoC (system-on-chip) product, particularly a wireless device intended for radio frequency signals at a frequency of several gigahertz. The multilayer wiring film 12 has, for instance, a seven-layer structure, and the wirings 14 are stacked in seven stages. A via 15 is provided below the wiring 14 in each stage. Furthermore, for instance, the wiring 14 of the uppermost layer forms an inductor (not shown).

In the inter-layer insulating film 13, sequentially from the bottom layer side, a TEOS layer 21, a SiCN layer 22, a $SiH_4$ layer 23, a TEOS layer 24, and a TEOS layer 25 are stacked. The TEOS layers 21, 24, and 25 are layers made of silicon oxide ($SiO_2$) deposited by the CVD (chemical vapor deposition) method using TEOS (tetraethyl orthosilicate) as a raw material. The SiCN layer 22 is a layer formed from silicon carbonitride (SiCN), which is a kind of low dielectric film (Low-k film). A low dielectric film is a film made of a material whose relative dielectric constant is lower than the relative dielectric constant (approximately 3.8) of silicon oxide (SiO$_2$). The SiH$_4$ layer 23 is a layer made of silicon oxide (SiO$_2$) deposited by the CVD method using monosilane (SiH$_4$) as a raw material. Here, the SiH$_4$ layer 23 may be replaced by a layer made of fluorine-containing silicate glass (FSG).

The via 15 of the lowermost layer is made of, for instance, tungsten (W), and the wiring 14 of the lowermost layer is made of, for instance, copper (Cu). These are provided in the TEOS layer 21. The vias 15 and wirings 14 of the second to fifth layers from the bottom are made of, for instance, copper (Cu) and provided in the SiCN layer 22. The via 15 and wiring 14 of the sixth layer from the bottom are made of, for instance, copper and provided in the SiH$_4$ layer 23. The via 15 and wiring 14 of the seventh layer from the bottom, i.e., the uppermost layer, are made of, for instance, copper and provided in the TEOS layer 24. The via 15 and the wiring 14 are not provided in the TEOS layer 25. In FIG. 1 and in FIG. 5 described below, the TEOS layer 25 is not shown. The wiring 14 of the uppermost layer provided in the TEOS layer 24 is thicker than the other wirings 14. The wiring 14 of the second layer from the top provided in the SiH$_4$ layer 23 is thinner than the wiring 14 of the uppermost layer and thicker than the wirings 14 of the first to fifth layers from the bottom provided in the TEOS layer 21 and the SiCN layer 22.

As viewed from above, the semiconductor device 1 has a rectangular shape. Furthermore, as viewed from above, a device region Rd is defined at the center of the semiconductor device 1. The device region Rd is a region for implementing the primary function of the semiconductor device 1 such as computation and data storage. In the device region Rd, an integrated circuit 16 is formed from the wirings 14 and vias 15 formed in the multilayer wiring film 12 and a diffusion region and a device isolation film (not shown) formed in the upper surface of the silicon substrate 11. On the outer edge of the device region Rd, a ring 31 is formed along this outer edge. The ring 31 is a frame-like structure formed by connecting the wirings 14 and vias 15 of the first layer to the seventh layer from the bottom along the vertical direction and the extending direction of the outer edge of the device region Rd. The ring 31 surrounds the integrated circuit 16.

As viewed from above, a circumferential region Rc is defined around the device region Rd. The circumferential region Rc is a region for protecting the device region Rd and is shaped like a frame surrounding the device region Rd. In the circumferential region Rc, a plurality of vertical structure bodies 32 are formed. The vertical structure body 32 is a structure formed by vertically connecting the wirings 14 and vias 15 of all layers, i.e., the first layer to the seventh layer from the bottom. The vertical structure body 32 is shaped like a vertically extending rod. As viewed from above, the vertical structure body 32 has a rectangular shape. The vertical structure body 32 does not function as part of the integrated circuit 16, but functions as an anchor for fixing the inter-layer insulating film 13 to the silicon substrate 11. When peeling occurs in the inter-layer insulating film 13 from an edge region Re, the vertical structure body 32 serves as a wall to block this peeling from progressing. In other words, the vertical structure body 32 functions as a stopper of peeling, which occurred in the inter-layer insulating layer 13.

As viewed from above, the edge region Re is defined around the circumferential region Rc. The edge region Re constitutes an outer edge portion of the semiconductor device 1 and is shaped like a frame surrounding the circumferential region Rc. The edge region Re does not include any vertical structure bodies. Furthermore, the edge region Re does not include any wirings 14 and vias 15 which do not constitute the vertical structure body. However, the inter-layer insulating film 13 is provided in the edge region Re. Furthermore, part of the mark structure 33 (see FIG. 5) may remain therein.

Next, a method for manufacturing a semiconductor device according to this embodiment is described.

Figure 4A:
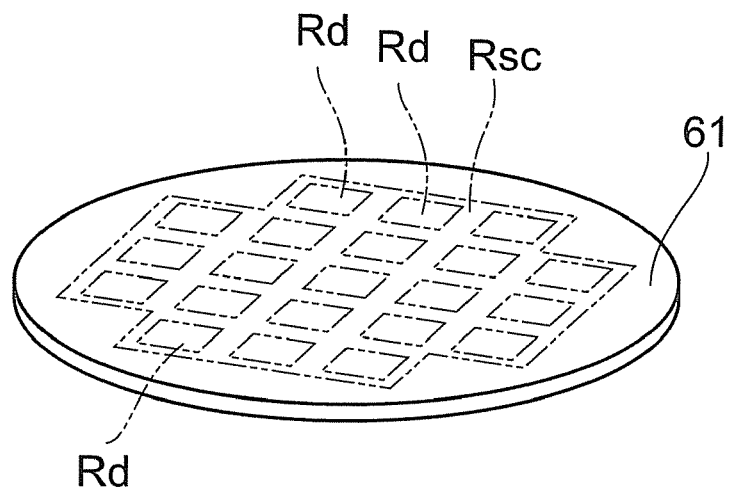
FIGS. 4A to 4C are perspective views illustrating a method for manufacturing the semiconductor device according to the first embodiment.
Figure 4B:
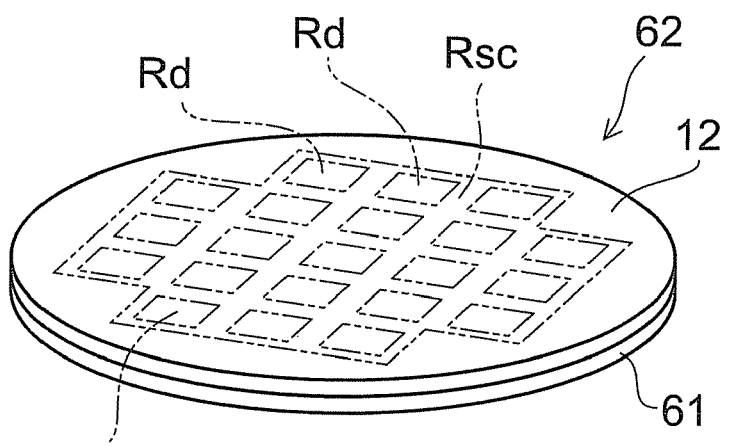
Figure 4C:
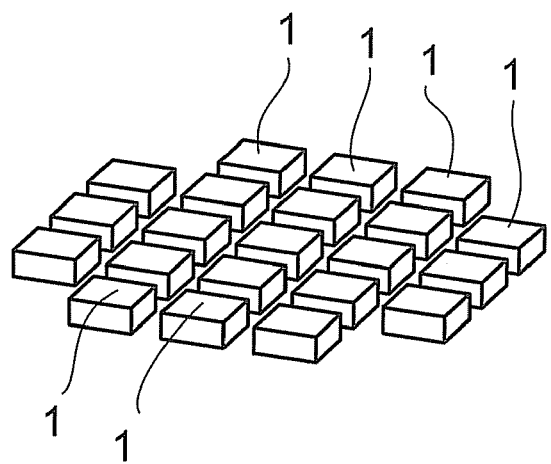

FIGS. 4A to 4C are perspective views illustrating the method for manufacturing a semiconductor device according to this embodiment.

Figure 5:
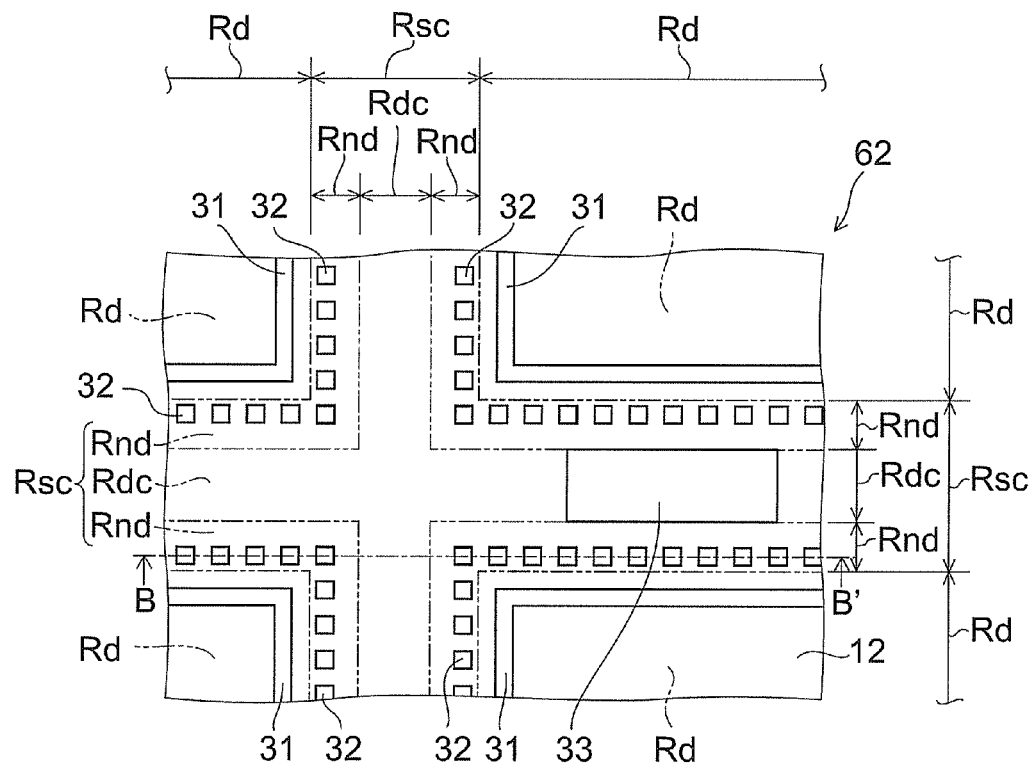
FIG. 5 is a plan view illustrating a wafer stacked body in the first embodiment.

FIG. 5 is a plan view illustrating a wafer stacked body in this embodiment.

Figure 6:
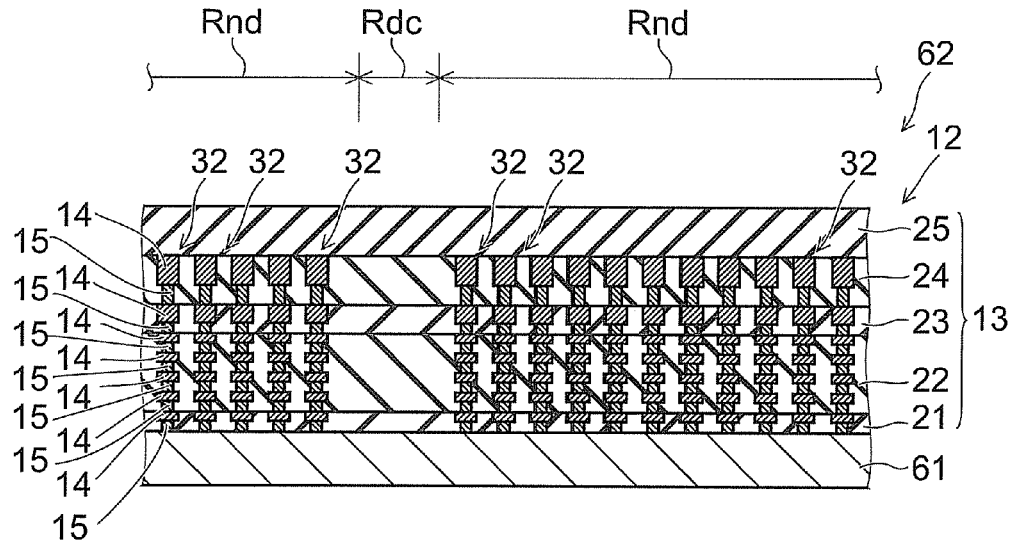
FIG. 6 is a cross-sectional view taken along line B-B' shown in FIG. 5.

FIG. 6 is a cross-sectional view taken along line B-B' shown in FIG. 5.

First, as shown in FIG. 4A, FIG. 5, and FIG. 6, a silicon wafer 61 is prepared. In the silicon wafer 61, a plurality of device regions Rd are defined. The plurality of device regions Rd are arranged in a matrix, for instance, and partitioned by a lattice-like scribe line region Rsc. A dicing region Rdc is defined at the widthwise center in each linear portion of the scribe line region Rsc. That is, the dicing region Rdc is located inside the scribe line region Rsc and shaped like a lattice so that the width of each linear portion of the dicing region Rdc is narrower width than the width of each linear portion of the scribe line region Rsc. The region of the scribe line region Rsc except the dicing region Rdc constitutes a non-dicing region Rnd.

Next, as shown in FIG. 4B, FIG. 5, and FIG. 6, a diffusion region and a device isolation film (not shown) are formed in the upper surface of the silicon wafer 61. Next, a multilayer wiring film 12 is formed entirely on the silicon wafer 61. The multilayer wiring film 12 is formed by providing wirings 14 and vias 15 in an inter-layer insulating film 13. Thus, a wafer stacked body 62 is fabricated from the silicon wafer 61 and the multilayer wiring film 12.

At this time, in each device region Rd, an integrated circuit 16 is formed from the diffusion region and the device isolation film formed in the upper surface of the silicon wafer 61, and the wirings 14 and vias 15 of the multilayer wiring film 12. Furthermore, a ring 31 is formed along the outer edge of each device region Rd. The ring 31 is formed by connecting the wirings 14 and vias 15 of all layers, i.e., the first layer to the seventh layer from the bottom, of the multilayer wiring film 12 along the vertical direction and the extending direction of the outer edge of the device region Rd.

Furthermore, in the non-dicing region Rnd which is the region of the scribe line region Rsc except the dicing region Rdc, a vertical structure body 32 is formed from the wirings 14 and vias 15. The vertical structure body 32 is formed by vertically connecting the wirings 14 and vias 15 of all layers, i.e., the first layer to the seventh layer from the bottom, of the multilayer wiring film 12. On the other hand, in the dicing region Rdc, no wirings 14 and vias 15 are formed. Hence, no vertical structure body 32 is formed in the dicing region Rdc. However, in the dicing region Rdc, a mark structure 33 used for alignment in each process and a TEG (test element group) (not shown) for characteristic management of a single device are formed.

Next, as shown in FIG. 4C, FIG. 5, and FIG. 6, the wafer stacked body 62 is diced into a plurality of semiconductor devices 1. Specifically, by a dicing blade (not shown), the multilayer wiring film 12 and the silicon wafer 61 located at the widthwise center of each linear portion of the dicing region Rdc are cut and removed. Thereby, the silicon wafer 61 is divided into a plurality of silicon substrates 11 each including the device region Rd, and the multilayer wiring film 12 is divided for each silicon substrate 11. Here, the widthwise center portion of each linear portion of the dicing region Rdc is eliminated, but both widthwise end portions remain, each constituting an edge region Re of the semiconductor device 1. Furthermore, the non-dicing region Rnd of the scribe line region Rsc constitutes a circumferential region Rc of the semiconductor device 1.

In the following, the dimension of each portion is described with an example.

The width of each linear portion of the scribe line region Rsc in the silicon wafer 61 is set to 95 μm. In this width, the width of the dicing region Rdc is set to 75 μm. Each linear portion of the dicing region Rdc is located at the widthwise center of the corresponding linear portion of the scribe line region Rsc. Thus, the non-dicing region Rnd is located in both widthwise end portions of each linear portion of the scribe line region Rsc and has a width of 10 μm each. Hence, in the diced semiconductor device 1, the width of the circumferential region Rc is 10 μm. Furthermore, as viewed from above, the vertical structure body 32 is shaped like a square measuring 1 μm on one side. In this case, because the width of the non-dicing region Rnd (circumferential region Rc) is 10 μm, about six rows of vertical structure bodies 32 can be arranged in the non-dicing region Rnd. That is, in the direction from the device region Rd to the edge region Re, a plurality of vertical structure bodies 32 may be arranged.

In the dicing region Rdc, the width of the region actually passed by the dicing blade is 30 to 40 μm. Hence, the remaining portion of the dicing region Rdc, i.e., the edge region Re in the diced semiconductor device 1, has an average width of approximately 20 μm. The dicing blade is brought into contact with the wafer stacked body 62 aiming at the center of the dicing region Rdc. However, actually, the dicing blade may be displaced from the center. In that case, the width of the edge region Re fluctuates.

Next, operational effects of this embodiment are described.

In this embodiment, vertical structure bodies 32 are provided in the non-dicing region Rnd of the scribe line region Rsc. This vertical structure body 32 serves as a stopper (wall) and achieves the effect of avoiding generation of the starting point of peeling between the inter-layer insulating film 13 and the wiring 14. Thus, the inter-layer insulating film 13 can be prevented from being peeled by the impact of dicing in dividing the wafer stacked body 62 into semiconductor devices 1. Furthermore, when the semiconductor device 1 is sealed with a mold resin and when the semiconductor device 1 is packaged, the inter-layer insulating film 13 can be prevented from being peeled by thermal stress generated between the mold resin and the inter-layer insulating film 13.

Furthermore, no vertical structure body 32 is formed in the dicing region Rdc of the scribe line region Rsc. Hence, during dicing, the metal material cut by the dicing blade is only the metal material forming the mark structure 33 and the TEG, for instance, and the total amount of the cut metal material is small. Thereby, the metal material attached to the dicing blade is reduced, and the dicing blade is less prone to clogging. Hence, the dicing blade can be used in good condition for a long period of time. Consequently, chipping due to the degradation of the dicing blade is less likely to occur, and peeling of the inter-layer insulating film 13 due to chipping is reduced. Furthermore, with the extension of service life of the dicing blade, the yield of the semiconductor device 1 increases. Hence, reduction in manufacturing cost and increase in throughput of the semiconductor device 1 can be expected.

Furthermore, in this embodiment, the ring 31 is formed to surround the integrated circuit 16 along the outer edge of the device region Rd. This can suppress the influence of dicing stress applied to the end portion of the semiconductor device 1 on the inter-layer insulating film 13 located in the device region Rd. Even if peeling occurs from the end portion of the semiconductor device 1 to the interface in the inter-layer insulating film 13, this peeling can be prevented from penetrating into the device region Rd. Although FIG. 1 and FIG. 2 show only one ring 31, the number of rings 31 is not limited to one. For instance, two to seven rings 31 can be formed.

Moreover, in the semiconductor device 1 according to this embodiment, the wiring 14 and the via 15 are not exposed at the end face of the multilayer wiring film 12. Hence, the amount of dust generated during assembly is small.

Next, a second embodiment of the invention is described.

Figure 7:
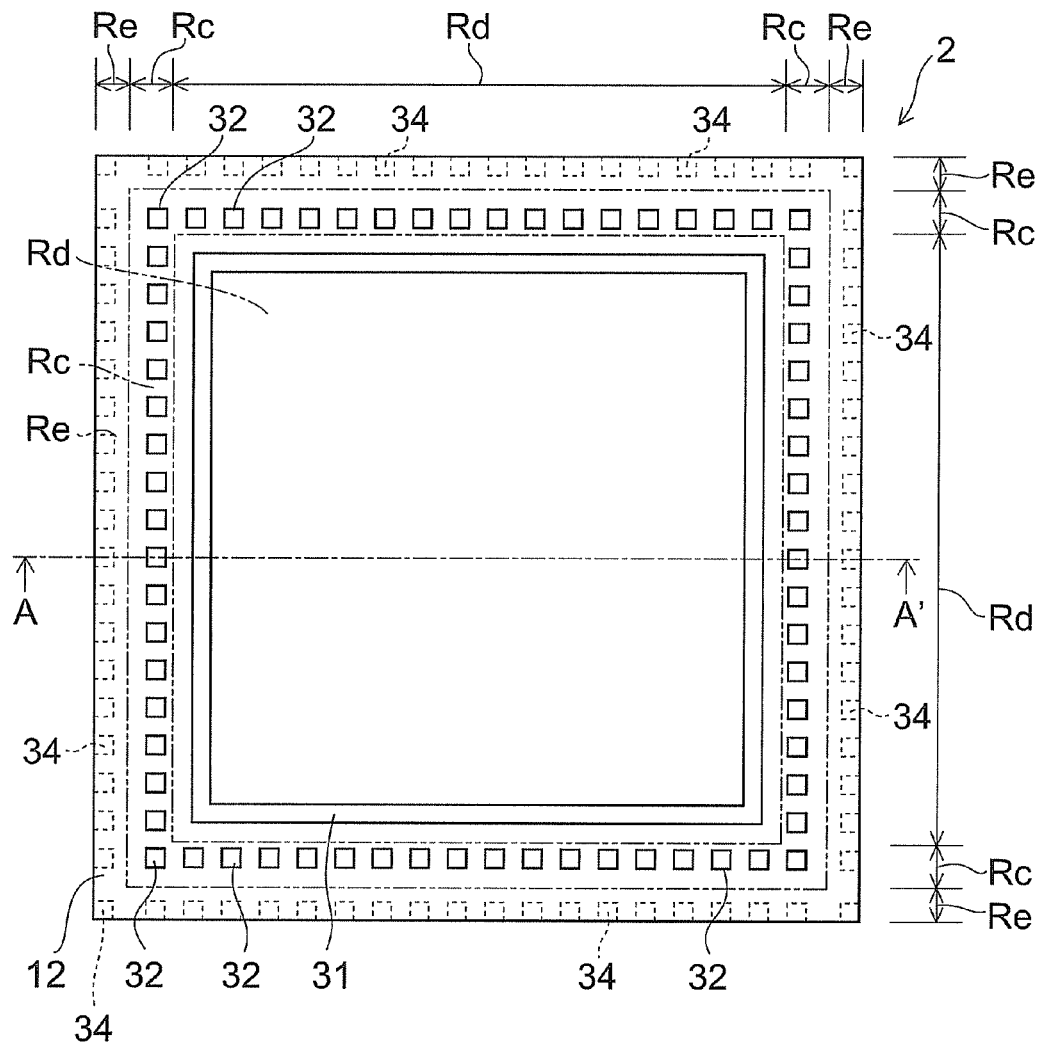
FIG. 7 is a plan view illustrating a semiconductor device according to a second embodiment.

FIG. 7 is a plan view illustrating a semiconductor device according to this embodiment.

Figure 8:
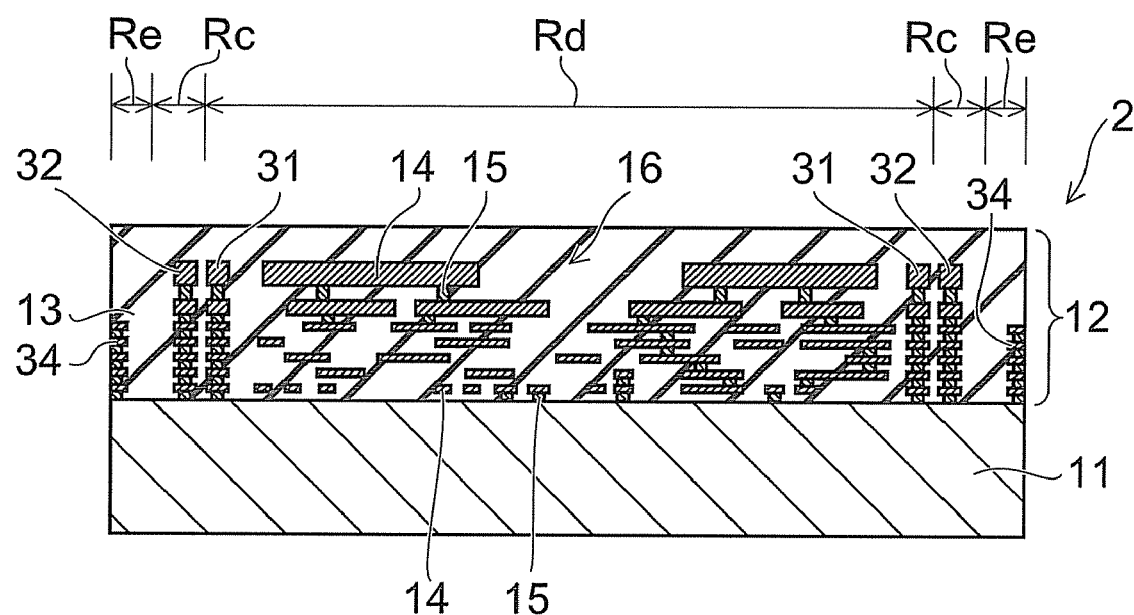
FIG. 8 is a cross-sectional view taken along line A-A' shown in FIG. 7.

FIG. 8 is a cross-sectional view taken along line A-A' shown in FIG. 7.

Figure 9:
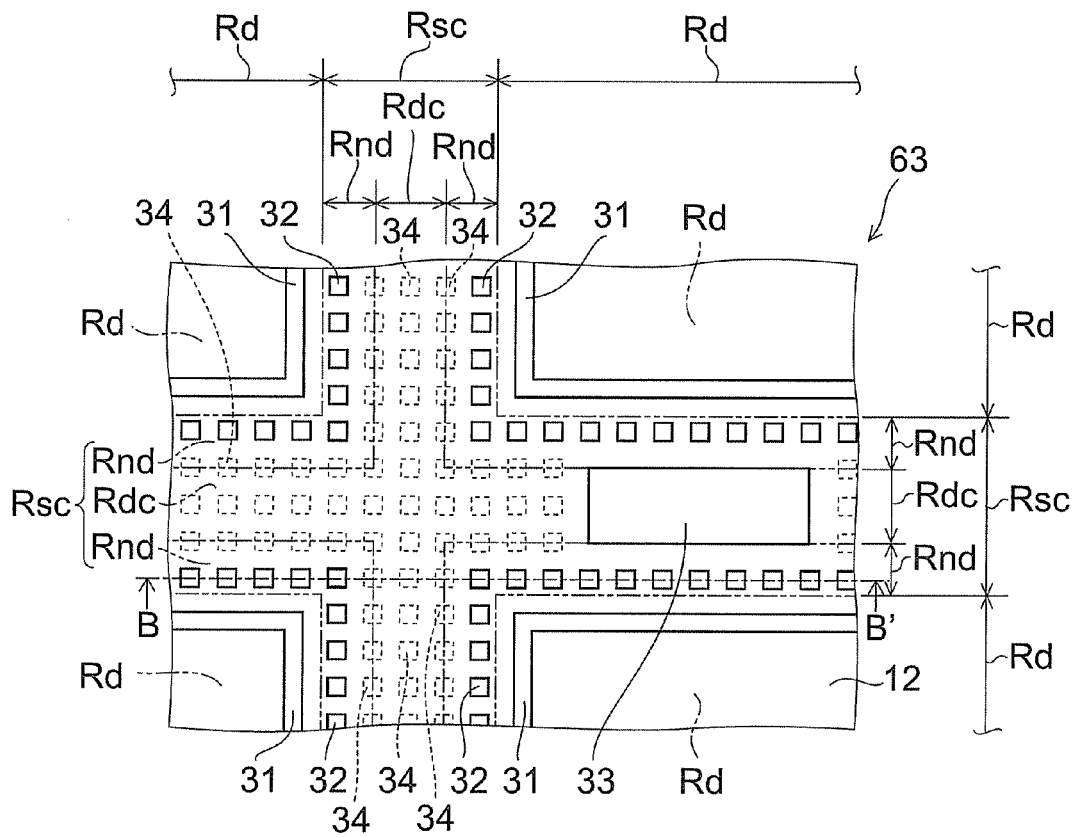
FIG. 9 is a plan view illustrating a wafer stacked body in the second embodiment.

FIG. 9 is a plan view illustrating a wafer stacked body in this embodiment.

Figure 10:
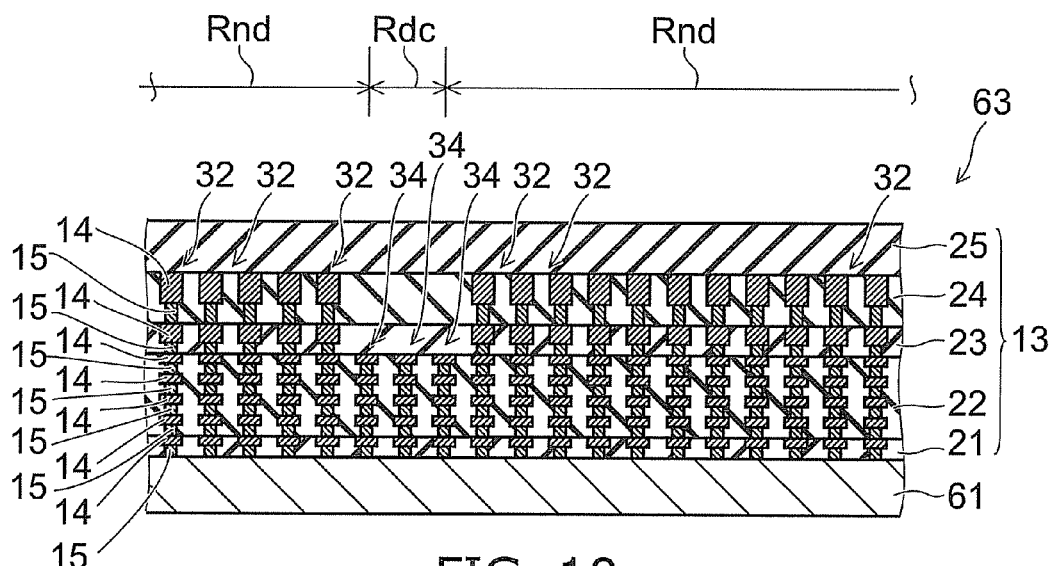
FIG. 10 is a cross-sectional view taken along line B-B' shown in FIG. 9.

FIG. 10 is a cross-sectional view taken along line B-B' shown in FIG. 9.

In FIG. 7 and FIG. 9, the TEOS layer 25 is not shown.

As shown in FIG. 7 and FIG. 8, the semiconductor device according to this embodiment is different from the semiconductor device 1 (see FIG. 1 and FIG. 2) according to the above first embodiment in that vertical structure bodies 34 are provided in the edge region Re. The vertical structure body 34 is configured by vertically connecting the wirings 14 and vias 15 of the first layer to the fifth layer from the bottom formed in the lower portion of the inter-layer insulating film 13, i.e., inside the TEOS layer 21 and the SiCN layer 22. The vertical structure body 34 is exposed at the end face of the semiconductor device 2.

As shown in FIG. 9 and FIG. 10, a method for manufacturing a semiconductor device according to this embodiment is different from that of the above first embodiment in that vertical structure bodies are formed also in the lower portion of the inter-layer insulating film 13 in the dicing region Rdc. Specifically, in the wafer stacked body 63, the wirings 14 and vias 15 of the first layer to the fifth layer from the bottom are formed in the lower portion of the inter-layer insulating film 13, i.e., inside the TEOS layer 21 and the SiCN layer 22, in the dicing region Rdc, and vertically connected to form a vertical structure body 34. On the other hand, the vertical structure body is not formed in the upper portion of the inter-layer insulating film 13, i.e., inside the $SiH_4$ layer 23, the TEOS layer 24, and the TEOS layer 25, in the dicing region Rdc.

Hence, the vertical structure body 34 is shorter than the vertical structure body 32. While the lower end of the vertical structure body 34 is in contact with the silicon wafer 61 like the vertical structure body 32, the upper end of the vertical structure body 34 is located at a lower position than the upper end of the vertical structure body 32. Furthermore, in the dicing process shown in FIG. 4C, when the multilayer wiring film 12 and the silicon wafer 61 are cut and removed, part of each vertical structure body 34 formed in the dicing region Rdc is removed to expose the remaining portion of the vertical structure body 34 at the dicing plane. Thereby, in the diced semiconductor device, the vertical structure body 34 remains in the lower portion of the inter-layer insulating film 13, i.e., in the TEOS layer 21 and the SiCN layer 22, in the edge region Re, and exposed at the end face of the TEOS layer 21 and the SiCN layer 22.

Here, depending on the displacement of the dicing region Rdc, the vertical structure body 34 may not be exposed at the end face of the semiconductor device 2. More specifically, if the dicing region Rdc is displaced away from the device region Rd, the inter-layer insulating film 13 may remain so as to cover the side surface of the vertical structure body 34. On the other hand, if the dicing region Rdc is displaced toward the device region Rd, the vertical structure body 34 may be removed by dicing and not remain in the diced semiconductor device 2. Furthermore, if the dicing region Rdc meanders, then the region where the side surface of the vertical structure body 34 is covered with the inter-layer insulating film 13, the region where the vertical structure body 34 is exposed, and the region lacking the vertical structure body 34 occur in combination.

The configuration and the manufacturing method of this embodiment other than the foregoing are similar to those of the above first embodiment. For instance, also in this embodiment, the vertical structure body 32 is formed in the non-dicing region Rnd. Thereby, in the diced semiconductor device, the vertical structure body 32 remains in the circumferential region Rc.

According to this embodiment, by providing the vertical structure body 34 in addition to the vertical structure body 32, the stopper effect is enhanced, and the dicing margin can be expanded as compared with the above first embodiment.

Furthermore, according to this embodiment, in the diced semiconductor device, the vertical structure body 34 is exposed at the end face of the SiCN layer 22 made of a low dielectric film. Hence, by that amount, the exposed area of the SiCN layer 22 is reduced, and moisture absorption of the SiCN layer 22 can be suppressed.

In this embodiment, the vertical structure body 34 is interposed in the region cut by the dicing blade. Hence, the vertical structure body 34 is partly cut by the dicing blade. However, the vertical structure body 34 is not provided in the upper portion of the inter-layer insulating film 13. In particular, the thickest wiring 14 of the uppermost layer is not included in the vertical structure body 34. Hence, the total amount of the cut metal material is small. Thus, even if the vertical structure body 34 is provided, clogging of the dicing blade does not substantially proceed.

In particular, in the case where the semiconductor device according to this embodiment is a device intended for radio frequency signals, an inductor is often formed from the wiring 14 in the uppermost layer of the multilayer wiring film 12. In this case, to reduce the resistance of the inductor, the wiring 14 of the uppermost layer is made as thick as, for instance, approximately 3 μm. This also increases the thickness of the wiring 14 of the uppermost layer constituting the vertical structure body 32. However, in this embodiment, the wiring 14 of the uppermost layer is not included in the vertical structure body 34 formed in the dicing region Rdc. Hence, even if the vertical structure body 34 is provided, the total amount of the cut metal material does not substantially increase. Hence, cutting the vertical structure body 34 does not cause rapid degradation of the dicing blade. The effect of this embodiment other than the foregoing is similar to that of the above first embodiment.

In the example shown in this embodiment, in the dicing region Rdc, the vertical structure body 34 is formed in the TEOS layer 21 and the SiCN layer 22. However, the invention is not limited thereto. For instance, the vertical structure body may be formed only in the TEOS layer 21 of the dicing region Rdc. Alternatively, the vertical structure body may be formed in the TEOS layer 21, the SiCN layer 22, and the SiH$_4$ layer 23. However, in the dicing region Rdc, the vertical structure body is not formed in the TEOS layer 24, which is the wiring layer of the uppermost layer.

Next, a comparative example is described.

Figure 11:
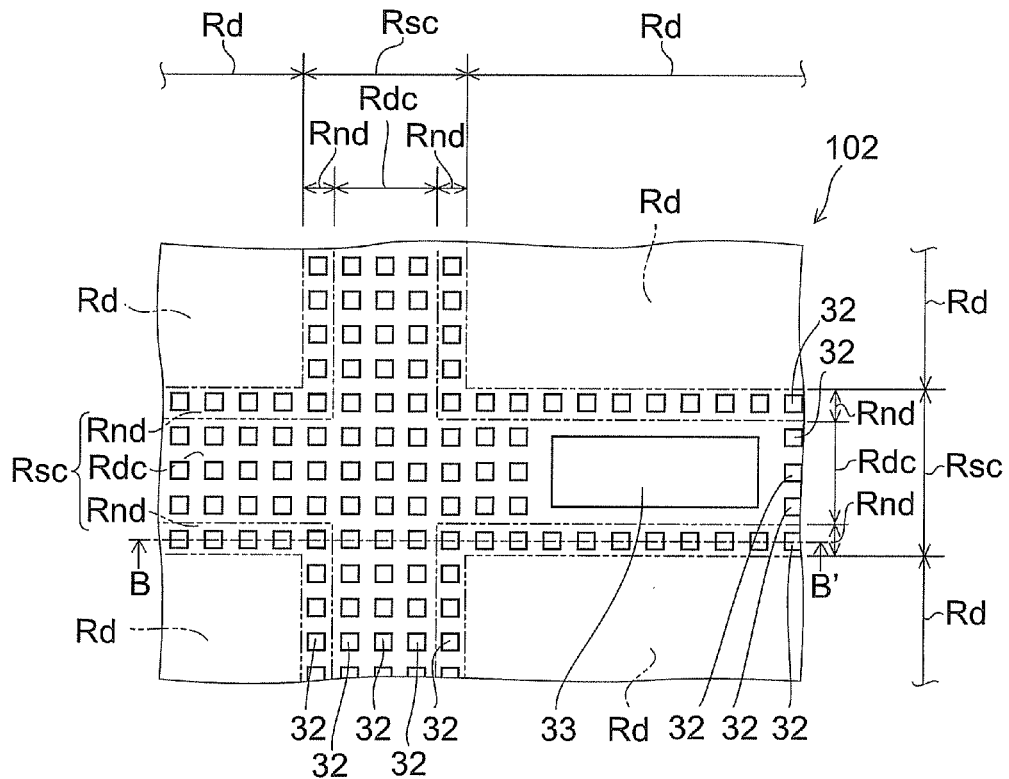
FIG. 11 is a plan view illustrating a wafer stacked body in a comparative example.

FIG. 11 is a plan view illustrating a wafer stacked body in this comparative example.

Figure 12:
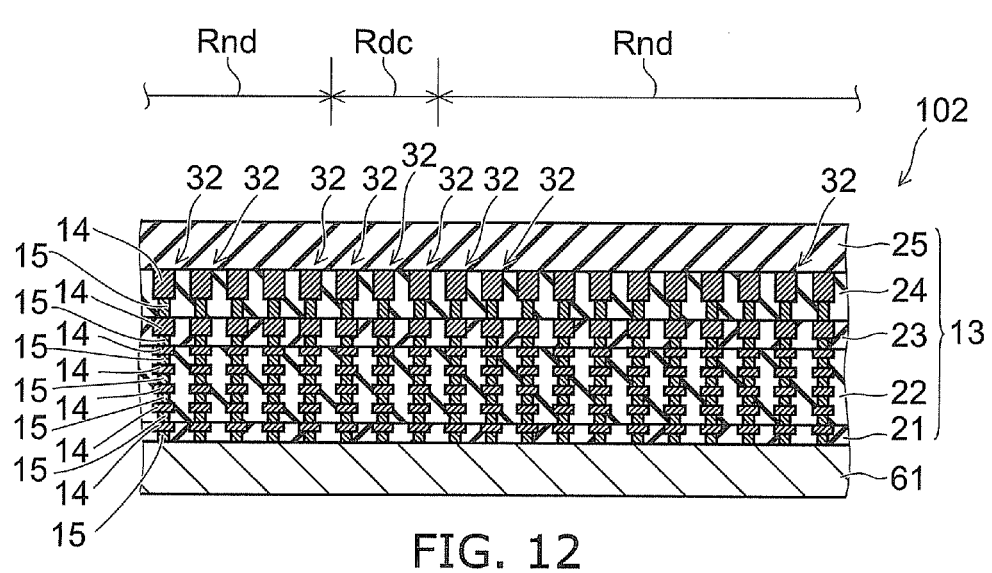
FIG. 12 is a cross-sectional view taken along line B-B' shown in FIG. 11.

FIG. 12 is a cross-sectional view taken along line B-B' shown in FIG. 11.

In FIG. 11, the TEOS layer 25 is not shown.

As shown in FIG. 11 and FIG. 12, in this comparative example, the vertical structure body 32 is formed also in the dicing region Rdc. More specifically, throughout the scribe line region Rsc of the wafer stacked body 102, wirings 14 and vias 15 of all layers, i.e., the first layer to the seventh layer from the bottom, are vertically connected inside the TEOS layer 21, the SiCN layer 22, the SiH$_4$ layer 23, the TEOS layer 24, and the TEOS layer 25 to form a vertical structure body 32. Thereby, in the diced semiconductor device, the vertical structure body 32 remains not only in the circumferential region Rc but also in the edge region Re. Furthermore, in the semiconductor device according to this comparative example, no ring 31 (see FIG. 1) is provided in the device region Rd.

In this comparative example, because the vertical structure body 32 is formed also in the dicing region Rdc, the total amount of the metal material cut by the dicing blade during dicing is large. Hence, if dicing is continued using the same dicing blade, the metal material is attached to the dicing blade and causes clogging. This makes chipping more likely to occur. Consequently, during dicing, the multilayer wiring film 12 is made prone to peeling. Even if peeling does not occur during dicing, the interface in the multilayer wiring film 12 is made fragile due to the stress applied during dicing. Thereby, in the assembling and packaging of the semiconductor device, if the mold resin sealing the semiconductor device is thermally contracted and applies stress to the multilayer wiring film 12 so as to cause warpage in the silicon substrate, peeling is more likely to occur in the inter-layer insulating film 13 of the multilayer wiring film 12. To prevent this, the dicing blade needs to be frequently replaced. However, this decreases the productivity of the semiconductor device and increases the manufacturing cost.

The embodiments described above can realize a semiconductor device in which the inter-layer insulating film is less prone to peel, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a semiconductor substrate;
an inter-layer insulating film provided on the semiconductor substrate;
a wiring provided in the inter-layer insulating film; and
a via provided in the inter-layer insulating film,
inside the inter-layer insulating film in a circumferential region around a device region, a vertical structure body being formed in which the wiring and the via are vertically connected, and
at least in an upper portion inside the inter-layer insulating film in an edge region located around the circumferential region and constituting an outer edge portion, no vertical structure body being formed in which the wiring and the via are vertically connected.

2. The device according to claim 1, wherein a lower portion inside the inter-layer insulating film in the edge region, a vertical structure body is formed in which the wiring and the via are vertically connected.

3. The device according to claim 2, wherein the vertical structure body is exposed at an end face of the semiconductor device.

4. The device according to claim 2, wherein
the wirings are stacked in multiple layers,
the wiring of an uppermost layer is thicker than the other wirings, and
the wiring of the uppermost layer is not included in the vertical structure body formed in the edge region.

5. The device according to claim 1, wherein in a lower portion inside the inter-layer insulating film in the edge region, no vertical structure body is formed in which the wiring and the via are vertically connected.

6. The device according to claim 1, wherein
the wirings are stacked in multiple layers, and
an inductor is formed from an uppermost layer of the wirings.

7. The device according to claim 1, wherein a lower portion of the inter-layer insulating film is formed from a low dielectric film.

8. The device according to claim 1, wherein on an outer edge of the device region, a ring is formed in which the wiring and the via are connected vertically and in an extending direction of the outer edge of the device region.

9. The device according to claim 1, wherein a plurality of the vertical structure bodies are arranged in a direction from the device region to the edge region.

10. A method for manufacturing a semiconductor device, comprising:
forming a multilayer wiring film including a wiring and a via provided in an inter-layer insulating film on a semiconductor wafer including a plurality of device regions partitioned by a scribe line region; and
dividing the multilayer wiring film and the semiconductor wafer for each of the device regions by dicing part of a dicing region defined in the scribe line region,
in the forming of the multilayer wiring film, a vertical structure body being formed in which the wiring and the via are vertically connected inside the inter-layer insulating film in a region of the scribe line region except the dicing region, and no vertical structure body being formed in which the wiring and the via are vertically connected at least in an upper portion inside the inter-layer insulating film in the dicing region.

11. The method according to claim 10, wherein in the forming of the multilayer wiring film, in a lower portion inside the inter-layer insulating film in the dicing region, a vertical structure body is formed in which the wiring and the via are vertically connected.

12. The method according to claim 10, wherein in the dividing, part of each of the vertical structure bodies formed in the dicing region is removed to expose a remaining portion of the vertical structure body at a dicing plane.

13. The method according to claim 10, wherein in the forming of the multilayer wiring film, in a lower portion inside the inter-layer insulating film in the dicing region, no vertical structure body is formed in which the wiring and the via are vertically connected.

14. The method according to claim 10, wherein in the forming of the multilayer wiring film, a lower portion of the inter-layer insulating film is formed from a low dielectric film.

15. The method according to claim 10, wherein the dicing region is located at widthwise center of each linear portion in the scribe line region.

16. The method according to claim 10, wherein the plurality of device regions are arranged in a matrix.

17. The method according to claim 10, wherein
in the forming of the multilayer wiring film, a low dielectric film is formed in a lower portion of the inter-layer insulating film,
in the forming of the multilayer wiring film, in the lower portion of the inter-layer insulating film in the dicing region, a vertical structure body is formed in which the wiring and the via are vertically connected, and
in the forming of the multilayer wiring film, in the upper portion of the inter-layer insulating film in the dicing region, the wiring and the via are not formed.

18. A semiconductor device comprising:
a semiconductor substrate;
an inter-layer insulating film provided on the semiconductor substrate, a lower portion of the inter-layer insulating film including a low dielectric film;
wirings provided in the inter-layer insulating film; and
vias provided in the inter-layer insulating film, inside the inter-layer insulating film in a circumferential region around a device region, a vertical structure body being formed in which some of the wirings and some of the vias are vertically connected,
in the lower portion of the inter-layer insulating film in an edge region located around the circumferential region and constituting an outer edge portion, a vertical structure body being formed in which some of the wirings and some of the vias are vertically connected, and
in an upper portion of the inter-layer insulating film in the edge region, one of the wirings and one of the vias being not formed.

19. The device according to claim 18, wherein the vertical structure body is exposed at an end face of the semiconductor device.

20. The device according to claim 18, wherein on an outer edge of the device region, a ring is formed in which the wiring and the via are connected vertically and in an extending direction of the outer edge of the device region.

* * * * *